(12) United States Patent
Lee et al.

(10) Patent No.: US 8,477,510 B2
(45) Date of Patent: Jul. 2, 2013

(54) FIXING STRUCTURE OF MULTI-LAYER PRINTED CIRCUIT BOARD

(75) Inventors: Joonghui Lee, Daejeon (KR); Sooyeup Jang, Daejeon (KR); Jeonkeun Oh, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 356 days.

(21) Appl. No.: 13/061,405

(22) PCT Filed: Sep. 4, 2008

(86) PCT No.: PCT/KR2008/005207
§ 371 (c)(1),
(2), (4) Date: Feb. 28, 2011

(87) PCT Pub. No.: WO2010/027111
PCT Pub. Date: Mar. 11, 2010

(65) Prior Publication Data
US 2011/0170271 A1 Jul. 14, 2011

(51) Int. Cl.
*H05K 5/00* (2006.01)

(52) U.S. Cl.
USPC .......................... 361/756; 361/807; 361/790

(58) Field of Classification Search
USPC ................ 361/807, 809, 810, 727, 756, 741, 361/790, 735, 728–730, 752, 796, 800
See application file for complete search history.

(56) References Cited

U.S. PATENT DOCUMENTS

| | | | | |
|---|---|---|---|---|
| 3,639,809 A | * | 2/1972 | Phlieger, Jr. | 361/124 |
| 4,503,484 A | * | 3/1985 | Moxon | 361/736 |
| 4,527,222 A | * | 7/1985 | Swingley, Jr. | 361/797 |
| 4,620,756 A | * | 11/1986 | Gatti et al. | 439/368 |
| 5,390,083 A | * | 2/1995 | Decker et al. | 361/796 |
| 5,835,349 A | | 11/1998 | Giannatto et al. | |
| 6,542,363 B2 | | 4/2003 | White | |
| 6,711,030 B2 | * | 3/2004 | Akiba | 361/803 |
| 6,768,646 B1 | | 7/2004 | Chen et al. | |
| 7,280,371 B2 | | 10/2007 | Barsun et al. | |

* cited by examiner

*Primary Examiner* — Hung S Bui
(74) *Attorney, Agent, or Firm* — The Webb Law Firm

(57) ABSTRACT

The present invention relates to a fixing structure of a raulti-layer printed circuit board, and more particularly, to a fixing structure of a multi-layer printed circuit board, which has a simple structure and a high fixing force using a printed circuit board fixing portion having slots.

3 Claims, 3 Drawing Sheets

FIXING STRUCTURE OF MULTI-LAYER PRINTED CIRCUIT BOARD

TECHNICAL FIELD

The present invention relates to a fixing structure of a multi-layer printed circuit board, and more particularly, to a fixing structure of a multi-layer printed circuit board, which has a simple structure and a high fixing force using a printed circuit board fixing portion having slots.

A printed circuit board refers to a thin plate to which electrical components such as integrated circuits, resistors and switches are soldered, and is used in various fields as well as the computer field.

BACKGROUND ART

A fixing structure for fixing printed circuit boards is shown in FIG. 1. The fixing structure of a conventional multi-layer printed circuit board, shown in FIG. 1, includes a printed circuit board case 120 to which printed circuit boards 110 are fixed; the printed circuit boards 110 each having a through-hole 111 formed at each corner thereof; bolts 130 each having a protrusion portion 131; and nuts 132 with which the bolts 130 are fixed.

The fixing structure of the multi-layer printed circuit board, shown in FIG. 1, has a structure in which the protrusion portion of the bolt is inserted into the through-hole of the printed circuit board to fix the printed circuit boards to each other, and the printed circuit boards are fixed to the printed circuit board case by the nut.

When a plurality of printed circuit boards are connected using bolts each having a protrusion portion as shown in FIG. 1, there is a problem in that, as the number of connection means is increased, a connecting operation time is increased, and therefore, manufacturing cost is increased.

Further, there is a problem in that a component such as the bolt does not appropriately maintain a fixing force because the strength of the component is weak due to the continuous exhaustion such as vibration.

Meanwhile, the number of printed circuit boards used in a battery control device used in a electric automobile or hybrid automobile is large, and a large number of printed circuit board are mounted in a narrow space as automobiles tend to be miniaturized. Since it takes a long period of time to fix printed circuit boards with a low fixing force using the conventional method, there is a problem in that productivity is considerably lowered.

DISCLOSURE

Technical Problem

Accordingly, the present invention is conceived to solve the aforementioned problems. An object of the present invention is to provide a fixing structure of a multi-layer printed circuit board, wherein a plurality of printed circuit boards are simply fixed by a one-time connection using a printed circuit board fixing portion having slots, so that efficiency of assembling and disassembling operations can be improved, and it is possible to prevent deformation and damage from occurring by improving a fixing force of the printed circuit boards.

Technical Solution

According to an aspect of the present invention for achieving the object, there is provided a fixing structure of a multi-layer printed circuit board, which includes: a plurality of printed circuit boards 10 each having through-holes 11 at corners thereof; a printed circuit board fixing portion 20 having a plurality of slots 21 into the corners of the printed circuit boards 10 are inserted to be fixed, and a fixing groove 22 formed long in a lateral direction so that the through holes 11 of the printed circuit boards 10 are exposed; and a connection means 30 guided along the fixing groove 22 and passing through the through-holes 11 of the respective printed circuit boards 10.

Further, a pair of the printed circuit board fixing portions 20 may be spaced apart from each other at a predetermined distance to fix both ends of the printed circuit boards 10.

Further, the printed circuit board fixing portion 20 may have a seating portion 23 formed to a predetermined depth at an inside thereof so that the printed circuit boards 10 are more stably fixed.

Further, the printed circuit board fixing portion 20 may have a plurality of ventilation portions 24 formed at the seating portion 23.

Advantageous Effects

Accordingly, the fixing structure of the multi-layer printed circuit board according to the present invention has an advantage in that a plurality of printed circuit boards can be simply fixed by a one-time connection using a printed circuit board fixing portion having slots, and the number of assembly components can be remarkably reduced through a simple configuration, thereby enhancing efficiency of assembling and disassembling operations of the multi-layer printed circuit board.

Further, the fixing structure of the multi-layer printed circuit board according to the present invention has an advantage in that it is possible to prevent deformation and damage from occurring by improving a fixing force.

DESCRIPTION OF DRAWINGS

The above and other objects, features and advantages of the present invention will become apparent from the following description of preferred embodiments given in conjunction with the accompanying drawings, in which.

DETAILED DESCRIPTION OF MAIN ELEMENTS

Figure 1:
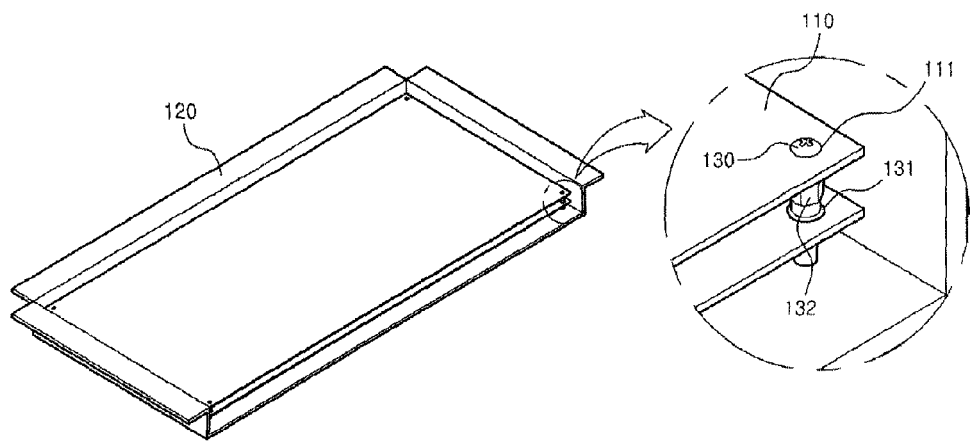
FIG. 1 is a perspective view of a conventional fixing structure of a printed circuit board.

10: printed circuit board
11: through-hole
20: printed circuit board fixing portion
21: slot
22: fixing groove
23: seating portion
24: ventilation portion
30: connection means
40: connector

BEST MODE

Hereinafter, a fixing structure of a multi-layer printed circuit board according to the present invention will be described in detail with reference to accompanying drawings.

Figure 2:
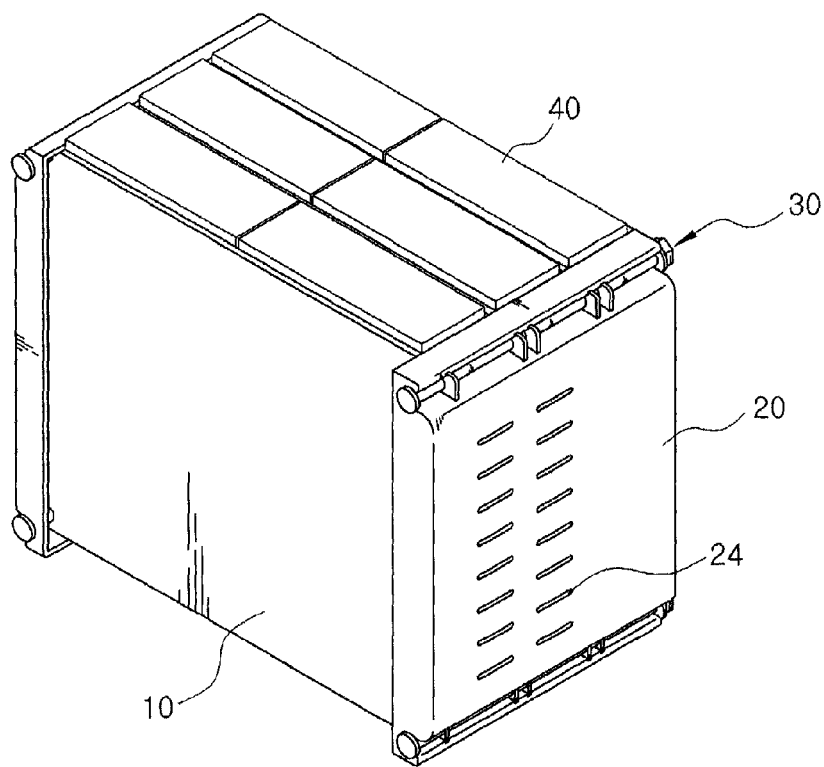
FIG. 2 is an assembled perspective view of a fixing structure of a multi-layer printed circuit board according to the present invention.

FIG. 2 is an assembled perspective view of the fixing structure of the multi-layer printed circuit board according to the present invention. The fixing structure of the multi-layer printed circuit board according to the present invention includes a plurality of printed circuit boards 10, a printed circuit board fixing portion 20 to which the plurality of printed circuit boards 10 are fixed, and a connection means 30.

such as a fuel cell, a plurality of printed circuit boards are frequently stacked to be used. Accordingly, a means for fixing a multi-layer printed circuit board is required to be suitable for an environment such as an automobile, in which vibrations are continuously generated.

In the present invention, the multi-layer printed circuit board is simply and firmly fixed using the printed circuit board fixing portion 20, which will be described in detail below.

The printed circuit board 10 has a through-hole 11 for connection, formed at each corner thereof.

The printed circuit board fixing portion 20 has a plurality of slots 21 into which the corners of the printed circuit boards 10 are inserted to be fixed, and a fixing groove 22 is formed long in a lateral direction so that the through holes 11 are exposed.

The width of the slot 21 is adjusted depending on the thickness of the printed circuit board 10, and the corner of the printed circuit board 10 is inserted into the slot 21 as shown in FIG. 2.

The connection means 30 is guided along the fixing groove 22 and fixed by passing through the through-holes 11 of the respective printed circuit board 10. Although it has been shown in FIG. 2 that the connection means 30 includes a bolt and nuts, any means capable of fixing the respective printed circuit boards by passing through the through-holes 11 of the printed circuit boards 10 may be used without limitation.

A connector 40 is a means for electrical connection between the printed circuit boards 10 and may be variously formed.

As described above, the present invention has an advantage in that the number of assembly components is remarkably decreased, thereby enhancing efficiency of assembling and disassembling operations of the multi-layer printed circuit board.

Figure 3:
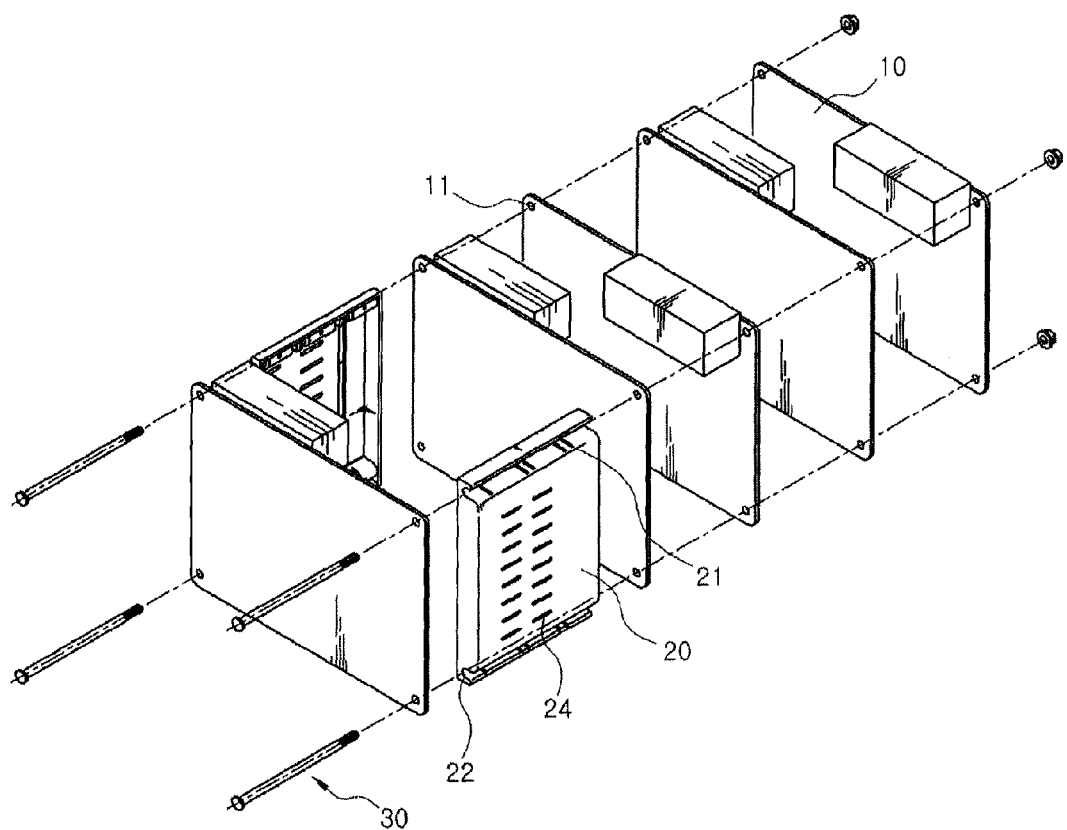
FIG. 3 is an exploded perspective view of the fixing structure of the multi-layer printed circuit board shown in FIG. 2.

FIG. 3 is an exploded perspective view of the fixing structure of the multi-layer printed circuit board shown in FIG. 2. In the fixing structure of the multi-layer printed circuit board according to the present invention, the corners of the printed circuit boards 10 are inserted into the slots 21 of the printed circuit board fixing portion 20, and the connection means 30 is inserted into the through-holes 11 respectively formed at the corners of the printed circuit boards 10 to connect the printed circuit boards, so that the plurality of printed circuit boards 10 are fixed to the printed circuit board fixing portion 20.

As shown in FIG. 3, it is preferred that a pair of the printed circuit board fixing portions 30 allow both ends of the printed circuit board 10 to be fixed while being spaced apart from each other at a predetermined distance, thereby enhancing a connection force and preventing deformation or the like due to vibration from occurring.

Figure 4:
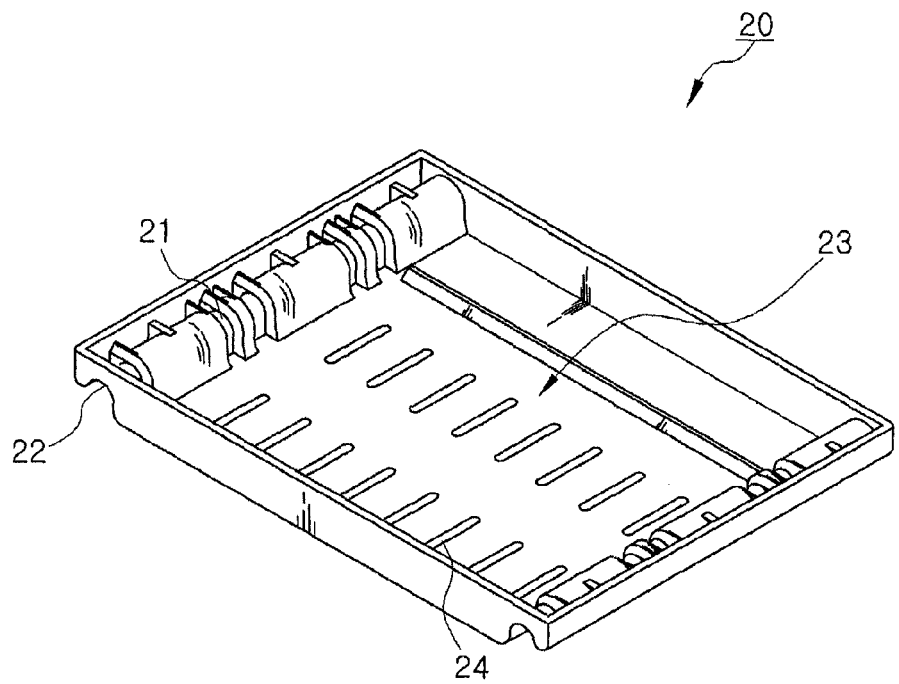
FIG. 4 is a perspective view of a printed circuit board fixing portion according to the present invention.

FIG. 4 is a perspective view of a printed circuit board fixing portion 20 according to the present invention.

Preferably, the printed circuit board fixing portion 20 has a seating portion 23 formed to a predetermined depth at an inside thereof into which the printed circuit boards 10 are inserted so that the printed circuit boards 10 are more stably fixed.

The corners of the printed circuit boards 10 are inserted into the slots 21 of the printed circuit board fixing portion 20, and the fixing force of the printed circuit boards 10 can be more enhanced due to the formation of the seating portion 23. One side of the printed circuit board 10 is supported by the seating portion 23 of the printed circuit board fixing portion 20, and the insertion length of the printed circuit board is adjusted.

The printed circuit board fixing portion 20 has a plurality of ventilation portions 24 formed at the seating portion 23.

Preferably, a large number of ventilation portions 24 are formed in the printed circuit board fixing portion 20 to prevent lowering of ventilation characteristics generated by fixing both ends of the printed circuit boards 10 when a pair of the printed circuit board fixing portions 20 are spaced apart from each other. Accordingly, heat generated in operation of the multi-layer printed circuit board can be easily discharged.

Figure 5:
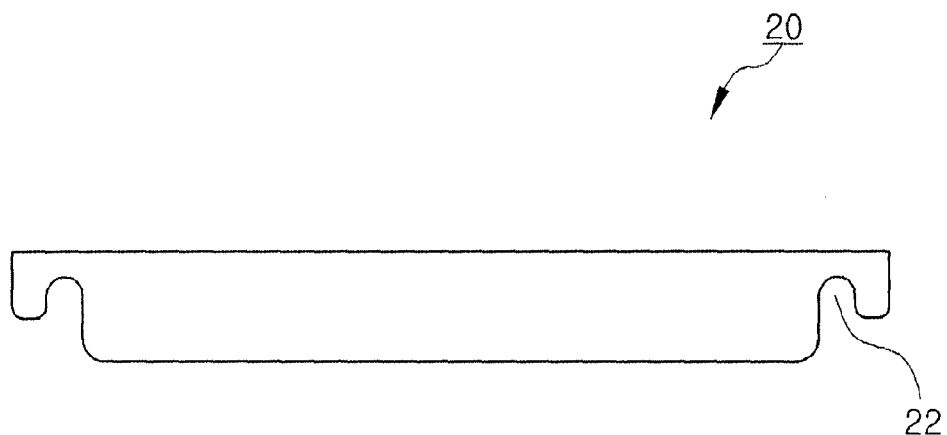
FIG. 5 is a plan view of the printed circuit board fixing portion according to the present invention.

FIG. 5 is a plan view of the printed circuit board fixing portion 20 according to the present invention. The drawing shown in FIG. 5 is a plan view seen from the top of the printed circuit board fixing portion 20, and the fixing grooves are formed long in a lateral direction so that the through-holes 11 of the printed circuit boards are exposed.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. A fixing structure of a multi-layer printed circuit board, comprising:
   a plurality of printed circuit boards each having through-holes at corners thereof;
   a printed circuit board fixing portion having a plurality of slots into the corners of the printed circuit boards are inserted to be fixed, and a fixing groove formed long in a lateral direction so that the through holes of the printed circuit boards are exposed;
   wherein the printed circuit board fixing portion has a seating portion formed to a predetermined depth at an inside thereof so that the printed circuit boards are more stably fixed; and
   a connection means guided along the fixing groove and passing through the through-holes of the respective printed circuit boards.

2. The fixing structure of the multi-layer printed circuit board as claimed in claim 1, wherein each pair of the printed circuit board fixing portions are spaced apart from each other at a predetermined distance to fix both ends of the printed circuit boards.

3. The fixing structure of the multi-layer printed circuit board as claimed in claim 1, wherein the printed circuit board fixing portion has a plurality of ventilation portions formed at the seating portion.

* * * * *